United States Patent …

(12) United States Patent
Tanaka (10) Patent No.: US 10,680,496 B2
(45) Date of Patent: Jun. 9, 2020

(54) MOTOR ATTACHMENT BRACKET, MOTOR ATTACHMENT STRUCTURE, AND SUBSTRATE PROCESSING APPARATUS

(71) Applicant: Ebara Corporation, Tokyo (JP)

(72) Inventor: Hideaki Tanaka, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 101 days.

(21) Appl. No.: 15/875,370

(22) Filed: Jan. 19, 2018

(65) Prior Publication Data

US 2018/0219456 A1    Aug. 2, 2018

(30) Foreign Application Priority Data

Jan. 30, 2017    (JP) ................. 2017-014291

(51) Int. Cl.
*H02K 5/20* (2006.01)
*H02K 9/19* (2006.01)
*H01L 23/367* (2006.01)

(52) U.S. Cl.
CPC .............. *H02K 9/19* (2013.01); *H02K 5/20* (2013.01); *H01L 23/367* (2013.01); *H02K 2205/00* (2013.01); *H02K 2209/00* (2013.01)

(58) Field of Classification Search
CPC ........ H02K 9/19; H02K 5/20; H02K 2209/00; H02K 2205/00; H01L 23/367
USPC .............................................. 310/52, 54, 64
See application file for complete search history.

(56) References Cited

U.S. PATENT DOCUMENTS

| | | | | | |
|---|---|---|---|---|---|
| 5,889,345 | A | * | 3/1999 | Iwata | B60T 8/4022 310/71 |
| 5,955,805 | A | * | 9/1999 | Chaudoreille | H02K 5/20 310/54 |
| 8,080,909 | B2 | * | 12/2011 | Perkins | B60K 6/48 310/52 |
| 2003/0173839 | A1 | * | 9/2003 | Torii | H02K 5/20 310/52 |
| 2006/0113851 | A1 | * | 6/2006 | Ishihara | H02K 9/20 310/52 |
| 2010/0194219 | A1 | * | 8/2010 | Hotta | B60K 1/00 310/54 |
| 2010/0295391 | A1 | * | 11/2010 | Perkins | B60K 6/48 310/64 |

(Continued)

FOREIGN PATENT DOCUMENTS

| | | |
|---|---|---|
| JP | 08-243511 A | 9/1996 |
| JP | 2002-066466 A | 3/2002 |
| JP | 2002-066899 A | 3/2002 |

*Primary Examiner* — John K Kim
(74) *Attorney, Agent, or Firm* — Abelman, Frayne & Schwab (57) ABSTRACT

Various examples, relating to motor attachment, a motor attachment structure, substrate processing apparatus are disclosed. The present disclosure exemplifies a motor attachment bracket including a plate-shaped motor mounting portion which an output shaft insertion hole through which an output shaft of a motor is inserted penetrates, and to which the motor the output shaft of which is inserted through the output shaft insertion hole is fixed. A fluid path in which a cooling fluid is circulated is formed in a metal member formed with the motor mounting portion, a motor attachment structure using the motor attachment bracket, and a substrate processing apparatus.

9 Claims, 5 Drawing Sheets

(56) References Cited

U.S. PATENT DOCUMENTS

| | | | | |
|---|---|---|---|---|
| 2013/0270936 A1* | 10/2013 | Mayor | ............... | H02K 9/19 310/54 |
| 2015/0280525 A1* | 10/2015 | Rippel | ............... | H02K 9/19 310/54 |
| 2018/0219456 A1* | 8/2018 | Tanaka | ............... | H02K 9/19 |

* cited by examiner

FIG. 7

MOTOR ATTACHMENT BRACKET, MOTOR ATTACHMENT STRUCTURE, AND SUBSTRATE PROCESSING APPARATUS

CROSS-REFERENCE TO RELATED APPLICATIONS

This application is based on and claims priority from Japanese Patent Application No. 2017-014291, filed on Jan. 30, 2017, with the Japan Patent Office, the disclosure of which is incorporated herein in its entirety by reference.

TECHNICAL FIELD

The present disclosure relates to a motor attachment bracket used for attachment to a motor support member, a motor attachment structure using the motor attachment bracket, and a substrate processing apparatus.

BACKGROUND

In many cases, an installation place of a motor in a substrate processing apparatus which performs polishing or cleaning of a substrate (e.g., a semiconductor wafer) has a sealed structure in consideration of waterproofness.

For example, in a substrate cleaning apparatus for scrub-cleaning a surface of a substrate with a roll cleaning member, the cleaning is performed by rotatably driving a cleaning member called a cleaning rotating body provided with cleaning rolls and a cleaning sheet by a driving force of a motor (an electric motor), and pushing the cleaning member against the surface of the substrate (see, e.g., Japanese Laid-Open Patent Publication Nos. 2002-066899, 2002-066466, and 08-243511). In many cases, the motor for rotatably driving the cleaning member is provided inside, for example, a housing having the sealed structure in consideration of the waterproofness.

In general, cooling heat generated by the driving of the motor provided in the installation place with the sealed structure is performed by radiation-cooling that spontaneously radiates the heat to components or a space (air) around the motor.

SUMMARY

In an aspect of the present disclosure, a motor attachment bracket includes a plate-shaped motor mounting portion which an output shaft insertion hole through which an output shaft of a motor is inserted penetrates, and to which the motor the output shaft of which is inserted through the output shaft insertion hole is fixed. A fluid path in which a cooling fluid is circulated is formed in a metal member formed with the motor mounting portion.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The heat of the motor provided in the installation place with the sealed structure is hard to be released, and due to a load applied to the motor and continuous use time of the motor, the surface temperature of the motor may exceed 100° C., and the motor (including, for example, an encoder installed in the motor) itself may be destroyed.

Further, the heat from the motor may adversely affect the peripheral components of the motor, and for example, thermal deformation of a vinyl chloride material (the heat resisting temperature thereof is generally 60° C.) may occur.

In consideration of the circumstances, for example, it may be conceivable to wrap a cooling tube in which a cooling fluid (e.g., water) flows, around the motor. However, in many cases, the space around the motor is narrow, and thus, the wrapping with the cooling tube may be impossible. Therefore, cases to which the wrapping with the cooling tube is applicable are restricted.

Although there has been proposed a technology which achieves the waterproofing performance and the cooling performance as disclosed in, for example, Japanese Laid-Open Patent Publication No. 2015-057014, the technology has a complicated structure and inevitably causes large increase of costs.

Embodiments of the present disclosure provide a motor attachment bracket which may implement space saving and cool a motor at low costs, a motor attachment structure using the motor attachment bracket, and a substrate processing apparatus.

(1) According to an aspect of the present disclosure, a motor attachment bracket includes a plate-shaped motor mounting portion which an output shaft through hole through which an output shaft of a motor is inserted penetrates, and to which the motor the output shaft of which is inserted through the output shaft insertion hole is fixed. A fluid path in which a cooling fluid is circulated is formed in a metal member formed with the motor mounting portion.

(2) The motor attachment bracket described in (1) above may include a plate-shaped cooling portion extending from the motor mounting portion and having the fluid path therein.

(3) In the motor attachment bracket described in (2) above, the cooling portion may extend from the motor mounting portion to be perpendicular to the motor mounting portion.

(4) According to another aspect of the present disclosure, in a motor attachment structure, the motor mounting portion of the motor attachment bracket described in any one of (1) to (3) above is fixed to a support to be disposed along a surface of the support, the motor is fixed to a side of the motor mounting portion which is opposite to the support, and the output shaft of the motor is inserted into a shaft insertion hole formed in the support via the output shaft insertion hole in the motor mounting portion.

(5) According to still another aspect of the present disclosure, a substrate processing apparatus includes a motor accommodation case inside a processing chamber where polishing or cleaning of a substrate is performed. The motor accommodation case accommodates the motor attachment bracket described in any one of (1) to (3) above and the motor fixed to the motor mounting portion of the motor attachment bracket. The motor mounting portion of the motor attachment bracket is fixed to a motor attachment wall provided in the motor accommodation case to be disposed along the motor attachment wall. The motor is fixed to a side of the motor mounting portion which is opposite to the motor attachment wall, and the output shaft of the motor is inserted into the output shaft insertion hole in the motor mounting portion and a shaft insertion hole formed in the motor attachment wall.

According to the embodiments of the present disclosure, the motor is fixed to the motor mounting portion of the motor attachment bracket which is fixed to the support such as, for example, an apparatus component member, so that the motor may be fixed to the support via the motor mounting portion. Further, the motor attachment bracket may cool the motor heated by the rotation driving with the motor mounting portion, by circulating a cooling fluid in the fluid path of the cooling portion.

The motor attachment bracket may cool the motor fixed to the motor mounting portion only by interposing the motor mounting portion between the support and the motor, and suppress the heat of the motor from being transferred to the support. The motor attachment bracket may be installed with implementation of space saving and easily installed in a narrow motor installation place (motor installation space). Further, the motor attachment bracket has a simple structure, may easily implement cost reduction, and may cool the motor at low costs.

Hereinafter, a motor attachment bracket, a motor attachment structure using the motor attachment bracket, and a substrate processing apparatus according to embodiments of the present disclosure will be described with reference to the accompanying drawings.

Figure 1:
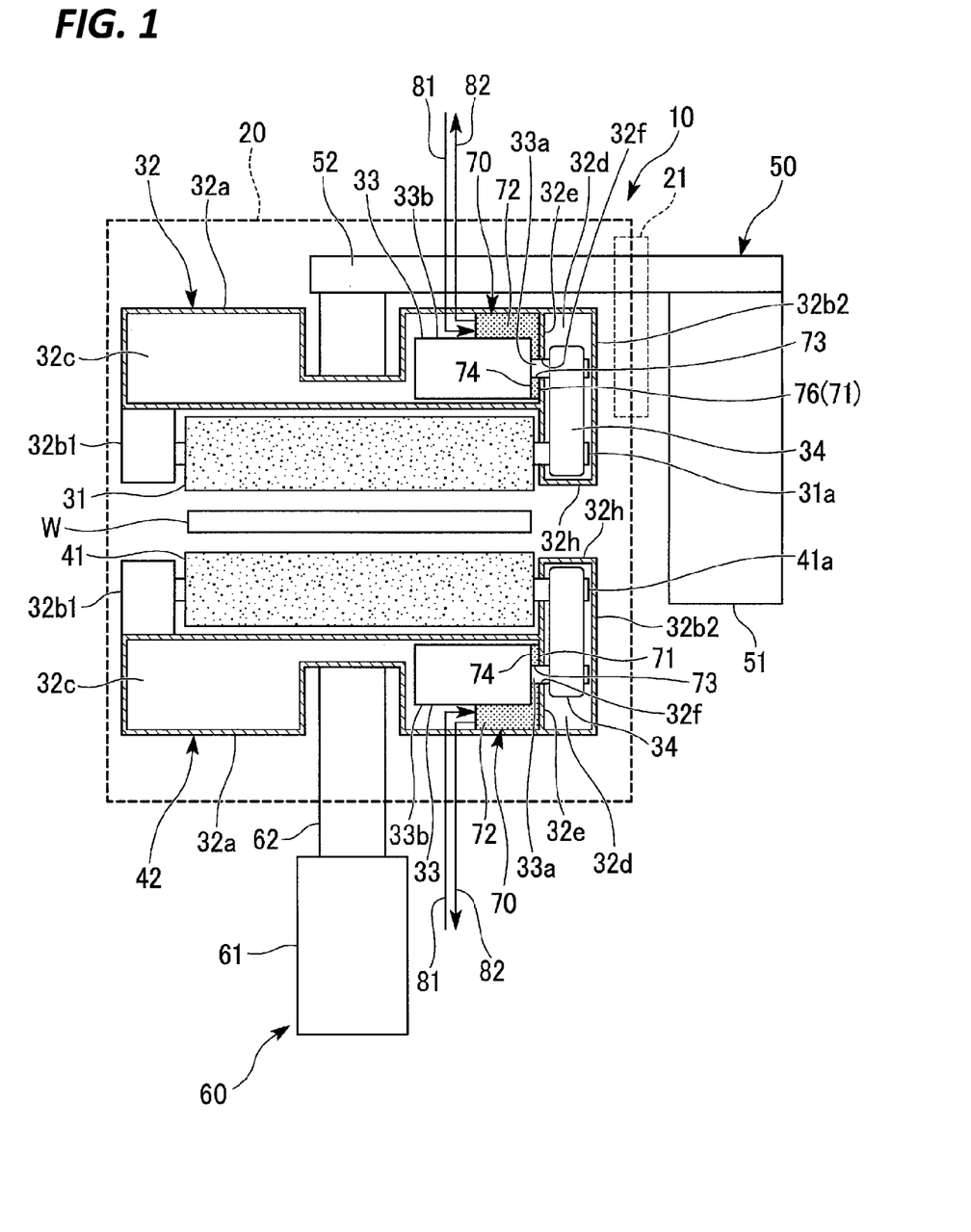
FIG. 1 is a front sectional view illustrating a structure of a substrate processing apparatus (a substrate cleaning apparatus) according to an embodiment of the present disclosure.

FIG. 1 is a view illustrating an example of a substrate processing apparatus 10 to which a motor attachment bracket and a motor attachment structure using the motor attachment bracket according to an embodiment of the present disclosure are applied.

A substrate processing apparatus 10 illustrated by example in FIG. 1 is a substrate cleaning apparatus for cleaning a surface of a semiconductor substrate such as, for example, a semiconductor wafer. Hereinafter, the substrate processing apparatus 10 of FIG. 1 may also be referred to as a "substrate cleaning apparatus."

The substrate cleaning apparatus 10 illustrated by example in FIG. 1 is a portion of an apparatus for performing chemical mechanical polishing (CMP), cleaning, and drying of a semiconductor substrate such as, for example, a semiconductor wafer (hereinafter, also referred to as a "CMP apparatus").

However, the substrate cleaning apparatus 10 is not limited to the configuration of a portion of the CMP apparatus, and may be used for cleaning a substrate in a semiconductor substrate manufacturing process accompanying no polishing.

The substrate cleaning apparatus 10 of FIG. 1 includes a housing 20 forming a processing chamber (a cleaning chamber) (hereinafter, also referred to as a "processing chamber housing"). The substrate cleaning apparatus 10 includes an upper roll holder 32 that supports an upper cleaning roll 31 to be rotatable around an axis, and a lower roll holder 42 that supports a lower cleaning roll 41 to be rotatable around an axis below the upper cleaning roll 31, inside the processing chamber housing 20.

Further, the substrate cleaning apparatus 10 includes an upper holder lifting device 50 that moves the upper roll holder 32 up and down, and a lower holder lifting device 60 that moves the lower roll holder 42 up and down.

The upper holder lifting device 50 includes a lifting device body 51 disposed outside the processing chamber housing 20, and a lifting arm 52 that is moved by the lifting device body 51. The lifting arm 52 supports the upper roll holder 52 at the tip end thereof which passes through an opening portion (not illustrated) formed at an upper portion of the processing chamber housing 20 to be disposed inside the processing chamber housing 20. The upper holder lifting device 50 moves the upper roll holder 32 and the upper cleaning roll 31 up and down by causing the lifting arm 52 to be moved up and down by the lifting device body 51.

In addition, a shutter mechanism 21 is provided at the upper portion of the processing chamber housing 20, to open the opening portion at the upper portion of the processing chamber housing 20 when the lifting arm 52 is moved vertically (in the vertical direction of FIG. 1), and close the opening portion when the lifting arm 52 is stopped.

The lower holder lifting device 60 includes a lifting device body 61 disposed below the processing chamber housing 20, and a lifting shaft 62 that is moved up and down by the lifting device body 61. The lifting shaft 62 supports the lower roll holder 42 at the tip end thereof which passes through an opening portion (not illustrated) formed at a lower portion of the processing chamber housing 20 to be disposed inside the processing chamber housing 20. The lower holder lifting device 60 moves the lower roll holder 42 and the lower cleaning roll 41 up and down by causing the lifting arm 62 to be moved up and down by the lifting device body 61.

Between the lifting shaft 62 and the inner periphery of the opening portion at the lower portion of the processing chamber housing 20 through which the lifting shaft 62 passes, the lifting shaft 62 may be smoothly moved up and down while leakage to the outside of the processing chamber housing 20 is prevented by the labyrinth structure (not illustrated).

The upper cleaning roll 31 and the lower cleaning roll 41 are supported by the roll holders (the upper roll holder and the lower roll holder), respectively, in the direction in which the rotation central axes thereof extend horizontally (in the lateral direction of FIG. 1). The spacing distance between the upper cleaning roll 31 and the lower cleaning roll 41 changes by the driving of one side or both sides of the upper holder lifting device 50 and the lower holder lifting device 60.

The substrate cleaning apparatus 10 of FIG. 1 cleans a substrate W (a semiconductor wafer in FIG. 1) carried into the processing chamber housing 20 through an opening/closing door (not illustrated) provided in the processing chamber housing 20, by placing the substrate W between the upper cleaning roll 31 and the lower cleaning roll 41, and supplying a cleaning liquid while causing each of the outer peripheral surfaces of the upper cleaning roll 31 and the lower cleaning roll 41 which are being rotated around their respective axes in mutually reverse directions, to be in contact with the substrate W.

In FIG. 1, the upper roll holder 32 and the lower roll holder 42 are members made of plastic.

The upper roll holder 32 includes a holder body 32a supported at the tip end of the lifting arm 52 of the upper holder lifting device 50 and extending horizontally, and roll support portions 32b1 and 32b2 protruding downwardly from the opposite ends of the holder body 32a in the extending direction of the holder body 32a. The upper roll holder 32 supports the opposite ends of a central shaft 31a of the upper cleaning roll 31 to be rotatable around an axis, by the roll support portions 32b1 and 32b2 at the opposite ends of the holder body 32a in the extending direction of the holder body 32a.

The holder body 32a of the upper roll holder 32 (hereinafter, also referred to as the "upper roll holder body") is a housing in which an internal space 32c is formed along the extending direction of the holder body 32a. The upper roll holder body 32a accommodates a motor 33 for rotatably driving the upper cleaning roll 31 and a motor attachment bracket 70 to be described later, in the internal space 32c.

The upper roll holder 32 provided inside the processing chamber housing 20 is exposed to the cleaning liquid scattering by the cleaning of the substrate W. However, the upper roll holder 32 ensures the waterproofness due to a sealed structure, and prevents the cleaning liquid from permeating thereinto. Thus, there is no concern that the motor 33 accommodated inside the upper roll holder 32 is to be wet with the cleaning liquid.

Hereinafter, of one pair of roll support portions 32b1 and 32b2, the roll support portion denoted by the reference numeral 32b1 in FIG. 1 may be referred to as a "first roll support portion," and the roll support portion denoted by the reference numeral 32b2 may be referred to as a "second roll support portion."

The second roll support portion 32b2 is formed at one side of the upper roll holder body 32a in the extending direction of the upper roll holder body 32a. In addition, the second roll support portion 32b2 has a portion protruding downwardly from the upper roll holder body 32a (a protruding support portion 32h), and supports the upper cleaning roll 31 (specifically, the central shaft 31a thereof) from the opposite side to the first roll support 32b1 by the protruding support portion 32h.

Inside the second roll support portion 32b2, a space 32d (a support portion internal space) is secured to accommodate the end portion of an output shaft 33a of the motor 33 which protrudes from the upper roll holder body 32a, and the end portion of the central shaft 31a of the upper cleaning roll 31. The second roll support portion 32b2 is in a form that the support portion internal space 32d is adjacent to the upper roll holder body 32a (specifically, a wall portion 32e blocking one side end of the internal space 32c in the extending direction of the internal space 32c), and constitutes a portion of the upper roll holder 32.

The wall portion 32e at the one side end of the upper roll holder body 32a in the extending direction of the upper roll holder body 32a functions as a partition wall between the internal space 32c and the support portion internal space 32d. Hereinafter, the wall portion 32e may be referred to as a "partition wall."

The partition wall 32e is a portion of the upper roll holder body 32a.

The partition wall 32e is made of plastic.

The motor attachment bracket 70 illustrated by example in FIG. 1 is in a form of an L-shaped plate having a plate-shaped motor mounting portion 71 fixed to the partition wall 32e of the upper roll holder body 32a, and a plate-shaped cooling portion 72 extending from a portion of the outer peripheral portion of the motor mounting portion 71 in the plane direction of the motor mounting portion 71 to be perpendicular to the motor mounting portion 71.

The motor mounting portion 71 is fixed to the partition wall 32e and disposed along the partition wall 32e. Specifically, the motor mounting portion 71 fixed to the partition wall 32e is installed along the face (surface) of the partition wall 32e which is directed toward the internal space 32c. The motor mounting portion 71 is fixed and attached to the partition wall 32e in the manner that the outer peripheral portion of the motor mounting portion 71 in the plane direction of the motor mounting portion 71 is fixed by, for example, bolts.

An output shaft insertion hole 73 is formed through the thickness of the motor mounting portion 71 at the central portion of the motor mounting portion 71 in the plane direction of the motor mounting portion 71. The output shaft 33a of the motor 33 to be fixed to the motor mounting portion 71 is inserted through the output shaft insertion hole 73.

In FIG. 1, the motor mounting portion 71 is fixed to the partition wall 32e by causing the output shaft insertion hole 73 to be aligned and communicate with an shaft insertion hole 32f formed through the partition wall 32e.

The output shaft 33a of the motor 33 protrudes from the motor body 33b having a configuration where a component for generating the rotation force of the output shaft 33a is accommodated in an external housing.

The motor 33 is attached to the motor attachment bracket 70 in the manner that the output shaft 33a of the motor 33 is inserted through the output shaft insertion hole 73 of the motor mounting portion 71 and the shaft insertion hole 32f of the partition wall 32e, and the motor body 33b is fixed to the motor mounting portion 71 (a motor attachment structure). The motor 33 (specifically, the motor body 33b) is fixed to the surface 74 of the motor mounting portion 71 which is opposite to the partition wall 32e. The motor 33 is fixed to the partition wall 32e (the upper roll holder 32) via the motor attachment bracket 70.

The upper roll holder 32 illustrated by example in FIG. 1 functions as a support to which the motor attachment bracket 70 is fixed, and a motor accommodation case for accommodating the motor 33.

The partition wall 32e of the upper roll holder 32 functions as a motor attachment wall.

As illustrated in FIG. 1, the output shaft 33a of the motor 33 protrudes into the support portion internal space 32d. The central shaft 31a of the upper cleaning roll 31 also protrudes into the support portion internal space 32d.

Pulleys (not illustrated) are fixed to the tip end of the output shaft 33a of the motor 33 which protrudes into the support portion internal space 32d, and the tip end of the central shaft 31a of the upper cleaning roll 31 which protrudes into the support portion internal space 32d, respectively. The motor 33 rotates the upper cleaning roll 31 by transferring a rotation driving force to the upper cleaning roll 31 via a belt 34 wrapped around the pulleys fixed to the output shaft 33a of the motor 33 and the central shaft 31a of the upper cleaning roll 31.

The cooling portion 72 of the motor attachment bracket 70 protrudes from the motor mounting portion 71 toward the side of the motor fixture surface 74 of the motor mounting portion 71 to be perpendicular to the motor mounting portion 71 (perpendicular to the motor fixture surface 74). The cooling portion 72 extends from the motor mounting portion 71 to be disposed along the motor 33 (specifically, the motor body 33b) fixed to the motor fixture surface 74 of the motor mounting portion 71.

Figure 2:
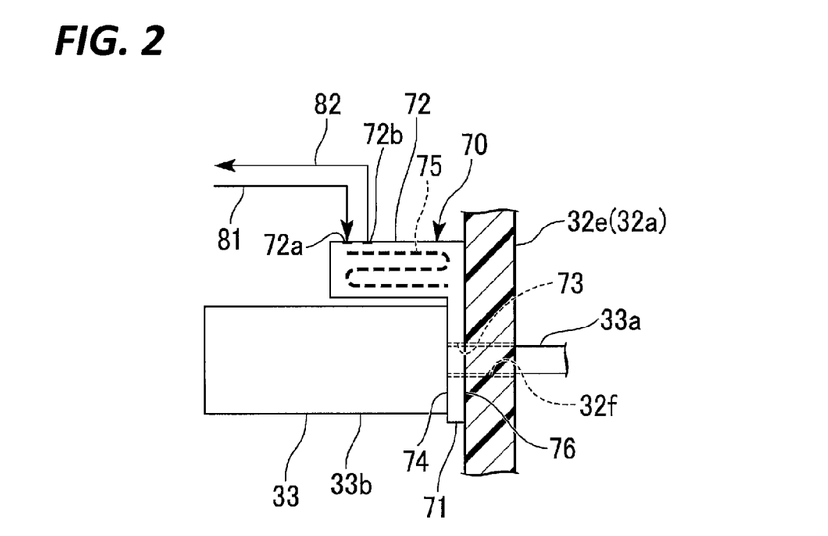
FIG. 2 is a view for explaining a motor attachment bracket and a motor attachment structure of the substrate processing apparatus of claim 1.

FIG. 2 is a sectional enlarged view illustrating a portion of the upper roll holder 32 in the vicinity of the motor attachment bracket 70.

As illustrated in FIG. 2, a fluid path 75 is formed in the cooling portion 72 to allow a cooling fluid (e.g., water) to be circulated therein. On the outer side of the cooling portion 75, a fluid inlet 72a is provided to make the cooling fluid flow into the fluid path 75, and a fluid outlet 72b is provided to discharge the cooling fluid flowing into the fluid path 75 from the fluid path 75.

The cooling fluid is fed to the fluid path 75 from a fluid feeding device (not illustrated) via a fluid feeding line 81 connected to the fluid inlet 72a. The cooling fluid fed to the fluid path 75 is discharged from the fluid path 75 to a fluid discharge line 82 connected to the fluid outlet 72b, by the continuous feeding of the cooling fluid to the fluid path 75.

The cooling portion 72 of the motor attachment bracket 70 is cooled by the circulation of the cooling fluid in the fluid path 75.

The entire motor attachment bracket 70 is a metal member formed of a metal with excellent heat conductivity such as, for example, stainless steel or aluminum. Thus, the motor attachment bracket 70 may cool not only the motor mounting portion 71 but also the motor 33 fixed to the motor mounting portion 71, by cooling the cooling portion 72 by the circulation of the cooling fluid in the fluid path 75.

In FIGS. 1 and 2, the cooling fluid circulated in the fluid path 75 of the motor attachment bracket 70 is specifically water.

The motor attachment bracket 70 configured to circulate water in the fluid path 75 may be made of stainless steel, in view of corrosion resistance.

In addition, as for the cooling fluid, liquid other than water or gas may be adopted.

In the substrate cleaning apparatus 10 of FIG. 1, the water discharged from the fluid path 75 to the fluid discharge line 72 is supplied as lubricating water from the fluid discharge line 82 to, for example, sliding portions between the members in the substrate cleaning apparatus 10. However, the substrate cleaning apparatus may adopt a configuration in which the water discharged from the fluid path 75 to the fluid discharge line 82 is not used as lubricating water.

The heat generated by the rotation driving of the motor 33 is transferred from the motor 33 to the motor mounting portion 71. However, since the motor attachment bracket 70 may cool the motor mounting unit 71 by cooling the cooling portion 72 by the circulation of the cooling fluid in the fluid path 75, increase of the temperature of the motor mounting portion 71 may be suppressed.

As a result, the motor attachment bracket 70 may cool the motor 33 through the motor mounting portion 71 and suppress the increase of the temperature of the motor 33.

Further, the motor attachment bracket 70 may suppress a transfer of the heat of the motor 33 to the partition wall 32e and increase of the temperature of the partition wall 32e caused from the transfer. Thus, the thermal deformation of the plastic partition wall 32e due to the heat of the motor 33 may be suppressed.

As illustrated in, for example, FIGS. 1 and 2, the motor attachment bracket 70 may be fixed to the partition wall 32e (a motor attachment wall) by causing one of the opposite surfaces of the motor mounting portion 71 to be directly in contact with the partition wall 32e.

The configuration to fix the motor mounting portion 71 to the partition wall 32e by causing one of the opposite surfaces of the motor mounting portion 71 to be directly in contact with the partition wall 32e may reduce the space required to accommodate the motor mounting portion 71 and the motor 33 (space saving), compared with a case where an interposer such as, for example, a heat insulator is provided, for example, between the motor mounting portion 71 and the partition wall 32e. As a result, the motor mounting portion 71 may be accommodated and installed (fixed to the motor attachment wall) in a relatively narrower motor installation place (a motor installation space).

The motor attachment bracket 70 has a simple configuration and may be manufactured at low costs. The motor attachment bracket 70 may implement the cooling of the motor 33 at low costs.

Further, the motor attachment bracket 70 may reduce the space required to accommodate the motor mounting portion 71 and the motor 33 (space saving), and is advantageous in that the motor mounting portion 71 is accommodated and installed (fixed to the motor attachment wall) in a narrow motor installation place (a motor installation space).

The lower roll holder 42 of the substrate cleaning apparatus 10 of FIG. 1 has a configuration implemented by turning the upper roll holder 32 upside down. The components of the lower roll holder 42 which are common to those of the upper roll holder 32 will be denoted by the same reference numerals as used for the common components of the upper roll holder 32, and descriptions thereof will be omitted.

The holder body 32a of the lower roll holder 42 is supported by the tip end of the lifting shaft 62 of the lower holder lifting device 60 and extends horizontally.

The lower roll holder 42 supports the opposite ends of a central shaft 41a of the lower cleaning roll 41 to be rotatable around an axis, by the roll support portions 32b1 and 32b2 (the first roll support portion 32b1 and the second roll support portion 32b2) protruding upwardly from the opposite ends of the holder body 32a in the extending direction of the holder body 32a. The second roll support portion 32b2 has a protruding support portion 32h protruding upwardly from the holder body 32a of the lower roll holder 42, and supports the lower cleaning roll 41 (specifically, the central shaft 41a thereof) from the opposite side to the first roll support 32b1 by the protruding support portion 32h.

Inside the second roll support portion 32b2, a space 32d (support portion internal space) is secured to accommodate the end portion of the output shaft 33a of the motor 33 which protrudes from the holder body 32*a* of the lower roll holder 42, and the end portion of the central shaft 41*a* of the lower cleaning roll 31. The second roll support portion 32*b*2 is in a form that the support portion internal space 32*d* is adjacent to the holder body 32*a* of the lower roll holder 42 (specifically, the wall portion 32*e* blocking one side end of the internal space 32*c* in the extending direction of the internal space 32*c*), and constitutes a portion of the lower roll holder 42.

The lower cleaning roll 41 is rotatably driven by the motor 33 accommodated in the internal space 32*c* of the holder body 32*a* of the lower roll holder 42.

Pulleys (not illustrated) are fixed to the tip end of the output shaft 33*a* of the motor 33 which protrudes into the support portion internal space 32*d*, and the tip end of the central shaft 41*a* of the lower cleaning roll 41 which protrudes into the support portion internal space 32*d*, respectively. The motor 33 rotates the lower cleaning roll 41 by transferring a rotation driving force to the lower cleaning roll 31 via the belt 34 wrapped around the pulleys fixed to the output shaft 33*a* of the motor 33 and the central shaft 41*a* of the lower cleaning roll 41.

The configuration to fix the motor 33 to the partition wall 32*e* of the holder body 32*a* via the motor attachment bracket 70 (a motor attachment structure) is similar to that in the upper roll holder 32.

In the lower roll holder 42 as well, the motor mounting portion 71 may be cooled by cooling the cooling portion 72 through the circulation of the cooling fluid in the fluid path 75 of the motor attachment bracket 70, as in the upper roll holder 32. As a result, the motor 33 may be cooled through the motor mounting portion 71, and the increase of the temperature of the motor 33 may be suppressed. Further, in the lower roll holder 42 as well, the transfer of the heat of the motor 33 to the partition wall 32*e* and the increase of the temperature of the partition wall 32*e* caused by the transfer may be suppressed, and the thermal deformation of the plastic partition wall 32*e* due to the heat of the motor 33 may be suppressed.

Figure 3:
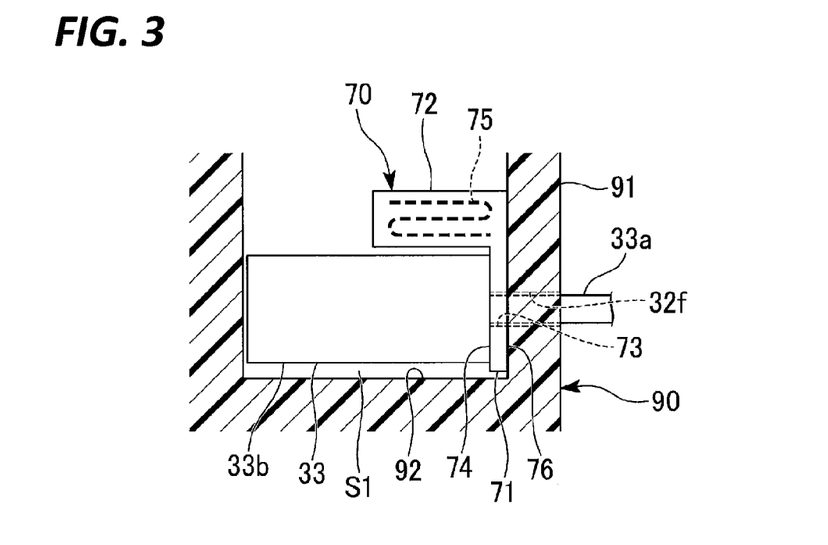
FIG. 3 is a view illustrating an example where the motor attachment bracket and a motor are accommodated in a concave-shaped motor installation space.
Figure 4:
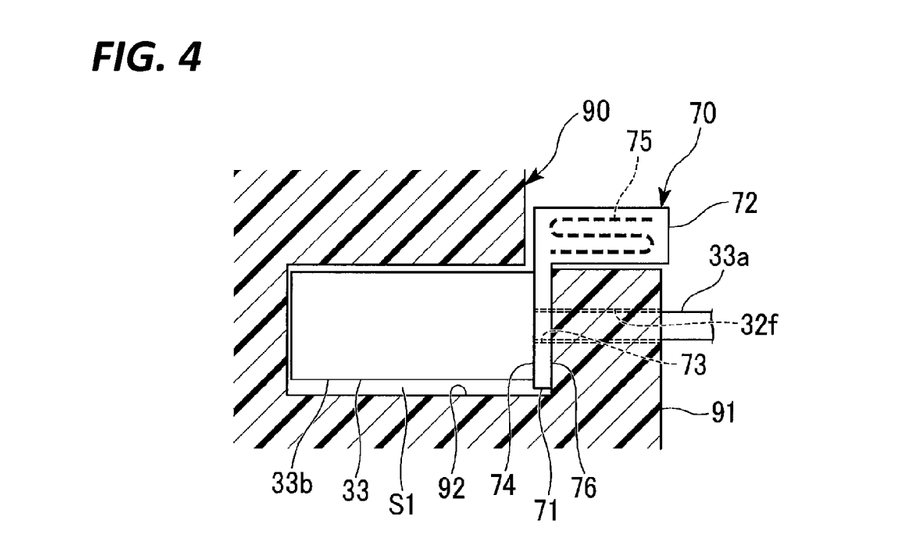
FIG. 4 is a view illustrating an example where the motor mounting portion of the motor attachment bracket and the motor are accommodated in the motor installation space, and a cooling portion of the motor attachment bracket is disposed outside the motor installation space.

As illustrated in FIGS. 3 and 4, the motor attachment bracket 70 may be fixed to the motor attachment wall formed in the motor accommodation case such as, for example, the upper roll holder 32 or the lower roll holder 42 of the substrate cleaning apparatus 10 of FIG. 1, while widely adapting to a shape or a peripheral structure of the motor installation place (the motor installation space) in the motor accommodation case.

FIG. 3 represents an example of a motor installation space S1 formed in a concave shape in a motor accommodation case 90. Further, FIG. 3 represents the motor attachment bracket 70 attached to a motor attachment wall 91 forming a portion of the internal surface of the motor installation space S1 by fixing the motor mounting portion 71 to the motor attachment wall 91, and a state where the motor 33 fixed to the motor mounting portion 71 of the motor attachment bracket 70 is accommodated.

Figure 5:
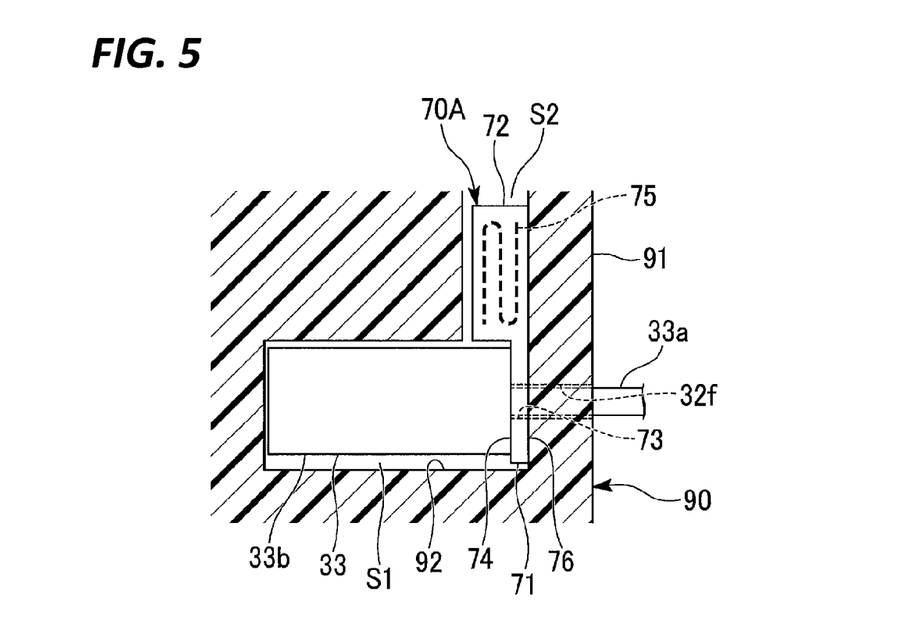
FIG. 5 is a view for explaining a modification of the motor attachment bracket, and represents an example of a motor attachment bracket having a configuration of a cooling portion extending from the motor mounting portion in a plane direction of the motor mounting portion.

FIG. 3 omits illustration of the fluid feeding line 81 connected to the fluid path 75 of the motor attachment bracket, the fluid discharge line 82, and the fluid inlet and the fluid outlet of the motor attachment bracket. FIGS. 4 and 5 also omit illustration of the fluid feeding line 81, the fluid discharge line 82, the fluid inlet, and the fluid outlet.

The cooling portion 72 of the motor attachment bracket 70 may be formed in a cylindrical shape protruding perpendicularly from the motor mounting portion 71 to surround the motor 33.

However, the cooling portion 72 protruding from the motor mounting portion 71 to be perpendicular to the plane direction of the motor mounting portion 71 may be a plate-shaped portion protruding from a portion of the outer peripheral portion of the motor mounting portion 71 in the plane direction of the motor mounting portion 71, in view of implementing the fixture of the motor attachment bracket 70 to the motor attachment wall while widely adapting to a shape or a peripheral structure of the motor installation space. For example, the cooling portion 72 may appropriately adopt a configuration of a plate-shaped portion protruding from a portion following one of the four sides of the outer peripheral portion of the rectangular plate-shaped motor mounting portion 71 in the plane direction of the motor mounting portion 71. The cooling portion 72 may be a plate-shaped portion protruding from a portion corresponding to a range of 50% or less, for example, about 25% of the entire circumference of the outer peripheral portion of the motor mounding portion 71 in the plane direction of the motor mounting portion 71, in view of implementing the fixture of the motor attachment bracket 70 to the motor attachment wall while widely adapting a shape or a peripheral structure of the motor installation space.

In FIG. 3, the motor 33 in the motor installation space S1 is provided near the inner bottom surface 92 of the motor installation space S1. A space large enough to accommodate the cooling portion 72 of the motor attachment bracket 70 is not secured between the motor 33 and the inner bottom surface 92 of the motor installation space S1.

In FIG. 3, the motor attachment bracket 70 implements the fixture of the motor mounting portion 71 to the motor attachment wall 91, by disposing the cooling portion 72 on the side opposite to the inner bottom surface 92 of the motor installation space S1 via the motor 33 fixed to the motor mounting portion 71.

The motor mounting portion 71 of the motor attachment portion 70 illustrated in FIGS. 1 to 4 specifically has a flat plate shape.

In the motor attachment bracket 70, any one of the opposite surfaces of the flat plate-shaped motor mounting portion 71 may be used as an attachment contact surface 76 that may be in contact with the motor attachment wall 71, or the motor fixture surface 74. When one of the opposite surfaces of the flat plate-shaped motor mounting portion 71 is used as the attachment contact surface 76, the other surface is used as the motor fixture surface 74.

As illustrated in FIG. 4, in the motor attachment bracket 70, the motor mounting portion 71 may be fixed to the motor attachment wall 91 by using the surface of the motor mounting portion 71 from which the cooling portion 72 protrudes, as the attachment contact surface 76 to be in contact with the motor attachment wall 91, and the cooling portion 72 may be disposed outside the motor installation space S1.

Further, in the case of FIG. 4, the surface of the motor mounting portion 71 which is opposite to the attachment contact surface 76, that is, opposite to the surface of the motor mounting portion 71 from which the cooling portion 72 protrudes is used as the motor fixture surface 74, and the motor 33 the motor body 33*b* of which is in contact with the motor fixture surface 74 is fixed to the motor mounting portion 71.

As illustrated in FIG. 5, the motor attachment bracket is not limited to the metal member having the configuration where the cooling portion 72 protrudes (extends) from the motor mounting portion 71 to be perpendicular to the motor mounting portion 71. As for the motor attachment bracket, it is possible to adopt a metal member having a configuration where the cooling portion 72 protrudes (extends) from the motor mounting portion 71 at an angle other than the right angle to the motor mounting portion 71.

A motor attachment bracket 70A illustrated in FIG. 5 has the configuration of the cooling portion 72 extending from the motor mounting portion 71 in the plane direction of the motor mounting portion 71.

In addition, FIG. 5 represents an example of a configuration where the space outside the motor installation space S1 in the motor accommodation case 90 is narrow, and the cooling portion 72 of the motor attachment bracket 70A the motor mounting portion 71 of which is fixed to the motor attachment wall 71 is disposed in a groove-shaped space S2 communicating with the motor installation space S1.

Figure 6:
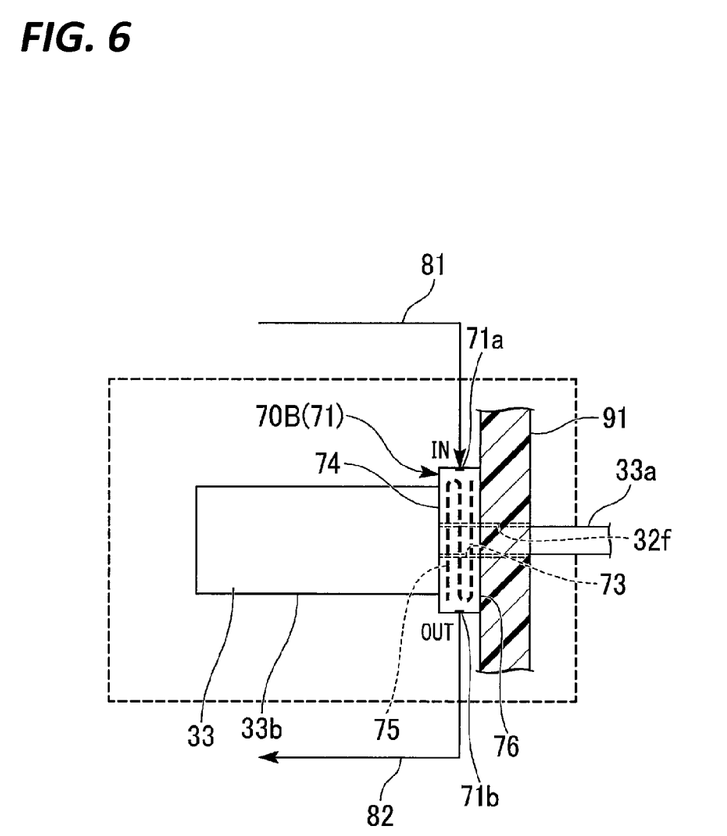
FIG. 6 is a view for explaining a modification of the motor attachment bracket, and represents an example of a motor attachment bracket having a configuration where a fluid path is formed in the motor mounting portion.

The motor attachment bracket is not limited to the configuration of the plate-shaped cooling portion 72 extending from the motor mounting portion 71, and may be a plate-shaped metal member having a configuration where the fluid path 74 is formed in the motor mounting portion 71 itself, as illustrated in FIG. 6.

The motor mounting portion 71 of a motor attachment bracket 70B serves as also the cooling portion. The fluid feeding line 81 and the fluid discharge line 82 are connected to the fluid inlet 71a and the fluid outlet 71b which are formed on the outer sides of the motor mounting portion 71, respectively. The motor attachment bracket 70B may discharge the cooling fluid fed to the fluid path 75 from the fluid feeding line 81 via the fluid inlet 71, from the fluid path 75 to the fluid discharge line 82 via the fluid outlet 71b.

Since the structure of the motor attachment bracket 70B of FIG. 6 is simple, compared with the motor attachment bracket having the configuration of the plate-shaped cooling portion 72 extending from the motor mounting portion 71, further cost reduction may be implemented.

However, in the motor attachment bracket having the configuration of the plate-shaped cooling portion 72 extending from the motor mounting portion 71 as illustrated in FIGS. 1 to 5, the fluid path 75 is formed in the separate cooling portion 72 from the motor mounting portion 71, so that the thickness dimension of the motor mounting portion 71 may be reduced, compared with the motor attachment bracket 70B of FIG. 6. Thus, in view of saving the space required to accommodate the motor mounting portion 71 and the motor 33 in the motor installation space, the motor attachment bracket having the configuration of the plate-shaped cooling portion 72 extending from the motor mounting portion 71 is advantageous, compared with the configuration of the motor mounting portion 71 serving as also the cooling portion.

Figure 7:
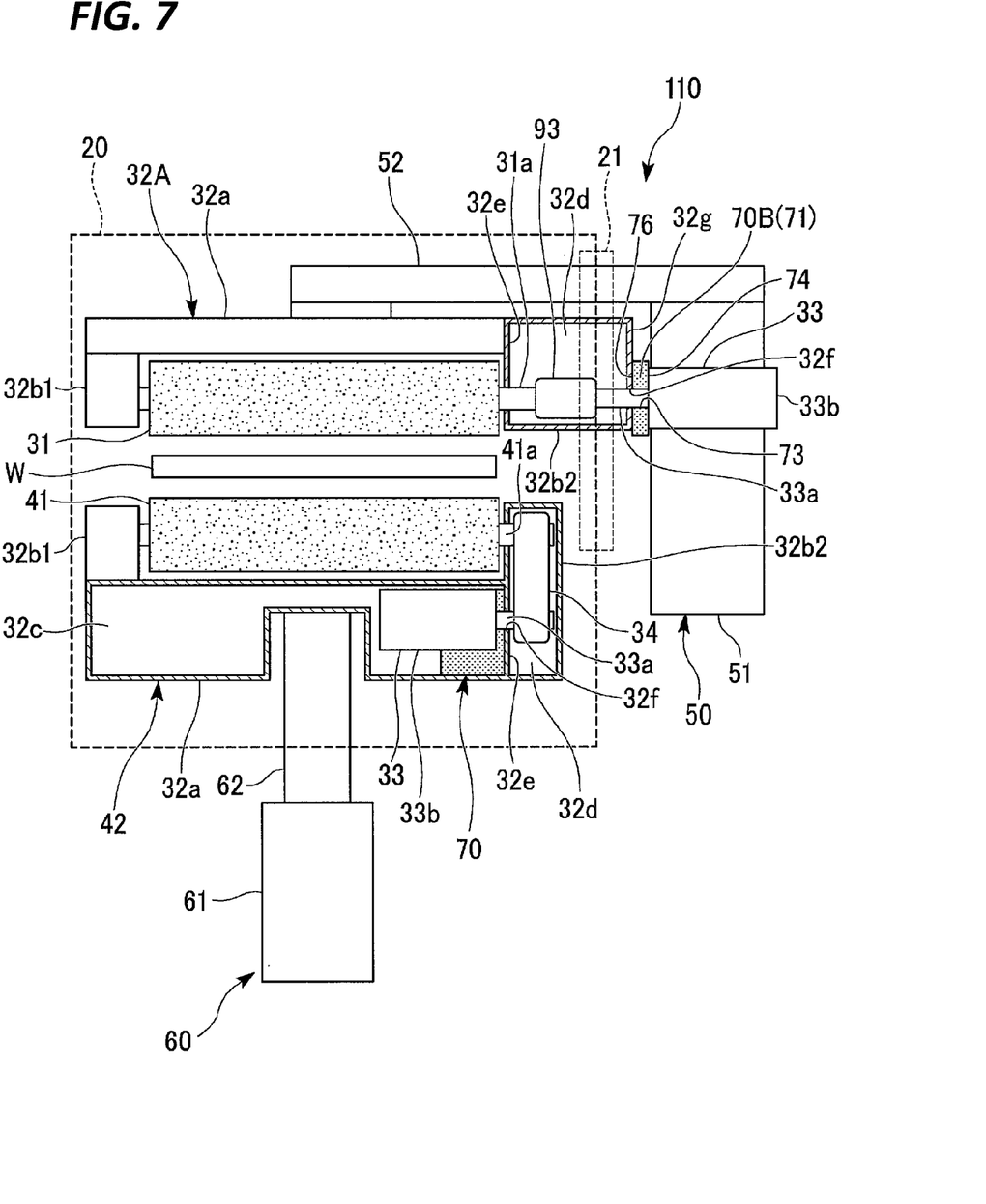
FIG. 7 is a view for explaining another embodiment of the substrate processing apparatus, and represents a configuration where the motor disposed outside a processing chamber housing is fixed to an upper roll holder that supports an upper cleaning roll via the motor attachment bracket.

FIG. 7 illustrates a substrate processing apparatus 110 according to another embodiment.

In the substrate cleaning apparatus 110 of FIG. 7, the motor 33 for rotatably driving the upper cleaning roll 31 is disposed outside the processing chamber housing 20, rather than inside the upper roll holder 32 as in the substrate cleaning apparatus 10 of FIG. 1.

Further, the substrate cleaning apparatus 110 of FIG. 7 includes the lower cleaning roll 41, the lower roll holder 42, and the lower holder lifting device 60 which are the same as those of the substrate cleaning apparatus 10 of FIG. 1. The dispositions of the motor 33, the belt 34 and others inside the lower roll holder 42, and the configuration to transfer the rotation driving force of the motor 33 to the lower cleaning roll 41 and rotatably drive the lower cleaning roll 41 are also the same as those in the substrate cleaning apparatus of FIG. 1.

The output shaft 33a of the motor 33 for rotatably driving the upper cleaning roll 31 is connected coaxially with the central shaft 31a of the upper cleaning roll 31 via a joint 93. In the substrate cleaning apparatus 110 of FIG. 7, the upper cleaning roll 31 is rotatably driven by transferring the rotation driving force of the motor 33 disposed outside the processing chamber housing 20 to the upper cleaning roll 31 via the joint 93.

The upper roll holder 32A of the substrate cleaning apparatus 110 of FIG. 7 supports the opposite ends of the central shaft 31a of the upper cleaning roll 31 to be rotatable around an axis, by the opposite roll support portions (the first roll support portion 32b1 and the second roll support portion 32b2) of the upper roll holder body 32a in the extending direction of the upper roll holder body 32a. However, the upper roll holder 32A of the substrate cleaning apparatus 110 of FIG. 7 is different from the upper roll holder 32 of the substrate cleaning apparatus 10 of FIG. 1 in that, in the upper roll holder 32A, the second roll support portion 32b2 at one side of the upper roll holder body 32a in the extending direction of the upper roll holder body 32a serves as also a joint accommodation case 32g for accommodating the joint 93 therein (in the support portion internal space 32d). The joint accommodation case 32g accommodates the joint 93 in the support portion internal space 32d which is the inside the joint accommodation case 32g. In addition, the substrate cleaning apparatus 110 of FIG. 7 is different from the substrate cleaning apparatus 10 of FIG. 1 in that the substrate cleaning apparatus 110 does not include the belt 34 and the pulleys for transferring the rotation driving force of the motor 33 to the upper cleaning roll 31. The upper roll holder 32A of the substrate cleaning apparatus 110 of FIG. 7 does not accommodate the belt 34 and the pulleys for transferring the rotation driving force of the motor 33 to the upper cleaning roll 31.

As described above, in the substrate cleaning apparatus 110 of FIG. 7, the motor 33 for rotatably driving the upper cleaning roll 31 is disposed outside the processing chamber housing 20 and is not accommodated in the upper roll holder 32A. In the upper roll holder 32A of the substrate cleaning apparatus 110 of FIG. 7, the space for accommodating the motor 33 for rotatably driving the upper cleaning roll 31 needs not to be secured.

The joint accommodation case 32g protrudes to the outside of the processing chamber housing 20 through an opening portion (not illustrated) at the upper portion of the processing chamber housing 20.

The motor 33 for rotatably driving the upper cleaning roll 31 is fixed to the portion of the joint accommodation case 32g that protrudes to the outside of the processing chamber housing 20, via the motor attachment bracket 70B in the configuration illustrated in FIG. 6.

The motor 33 for rotatably driving the upper cleaning roll 31 is moved up and down by the upper holder lifting device 50 along with the lifting arm 52 and the upper roll holder 32A.

The output shaft 33a of the motor 33 passes through the output shaft insertion hole 73 penetrating the motor mounting portion 71, and the shaft insertion hole 32f formed in the joint accommodation case 32g. The motor 33 is fixed to the motor mounting portion 71 of the motor attachment bracket 70B, by causing the motor body 33b to be in contact with the motor fixture surface 74 which is opposite to the joint accommodation case 32g.

Even when the motor 33 fixed to the motor mounting portion 71 of the motor attachment bracket 70B is heated by the rotation driving, the motor 33 is cooled by the motor mounting portion 71 having the fluid path 75 where the cooling fluid is circulated, and the increase of the temperature is suppressed. Further, in the structure where the motor 33 is fixed to the joint accommodation case 32g via the motor attachment bracket 70B (a motor attachment structure), the heat by the rotation driving of the motor 33 may be suppressed from affecting the joint accommodation case 32g.

In addition, the motor attachment bracket used for fixing the motor 33 to the joint accommodation case 32g is not limited to the configuration of the motor attachment bracket 70B illustrated by example in FIG. 6. As for the motor attachment bracket used for fixing the motor 33 to the joint accommodation case 32g, a motor attachment bracket having the configuration of the plate-shaped cooling portion 72 extending from the motor mounting portion 71 may be adopted as illustrated by example in FIGS. 1 to 5.

As a modification, in a substrate cleaning apparatus including a chamber body, two rollers disposed inside the chamber and supporting a substrate in a substantially vertical posture, and a nozzle for spraying a pressurized fluid toward one or more areas of the substrate while being moved in parallel with the substrate, the motor attachment bracket of the present disclosure may be adopted for supporting motors for rotating the two rollers, respectively (attaching the motors to an apparatus component member), so as to cool the motors.

In addition, while a motor may be used as one driving system in a substrate conveyance apparatus used for various semiconductor manufacturing apparatuses, a space for cooling the motor may be insufficient. In that case as well, the motor may be cooled by adopting the motor attachment bracket of the present disclosure.

For example, the substrate processing apparatus is not limited to the substrate cleaning apparatus, and may be adopted for various semiconductor manufacturing apparatuses such as, for example, a substrate polishing apparatus for polishing the surface of a substrate (e.g., a semiconductor wafer).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a motor accommodation case inside a processing chamber where polishing or cleaning of a substrate is performed, wherein the motor accommodation case accommodates a motor attachment bracket comprising:
        a flat motor mount having a first side facing a motor and a second side opposite the first side;
        an output shaft insertion hole extending through the first side and the second side of the motor mount through which an output shaft of the motor extends; and
        a fluid path in which a cooling fluid is circulated,
        wherein the first side of the motor mount is fixed to the motor and the fluid path is positioned between the second side of the motor mount and the motor, and the second side of the motor mount of the motor attachment bracket is fixed to a motor attachment wall provided in the motor accommodation case to be disposed along the motor attachment wall, the motor is fixed to the first side of the motor mount which is opposite to the motor attachment wall, and the output shaft of the motor extends through the output shaft insertion hole in the motor mount and a shaft insertion hole formed in the motor attachment wall.

2. The substrate processing apparatus of claim 1, wherein the second side of the motor mount of the motor attachment bracket is fixed to a support to be disposed along a surface of the support, the first side of the motor mount is opposite to the support, and the output shaft of the motor extends through a shaft insertion hole formed in the support via the output shaft insertion hole in the motor mount.

3. The substrate processing apparatus of claim 1, further comprising:
    a fluid inlet and a fluid outlet which are formed on outer sides of the motor mount, respectively.

4. The substrate processing apparatus of claim 1, wherein the motor attachment bracket is made of metal.

5. The substrate processing apparatus of claim 1, wherein the motor attachment bracket is located inside the motor accommodation case accommodating the motor, and
    the motor accommodation case is housed in a housing forming the processing chamber.

6. A substrate processing apparatus comprising:
    a motor accommodation case inside a processing chamber where polishing or cleaning of a substrate is performed, the motor accommodating case including a motor attachment wall provided in the motor accommodation case,
    wherein the motor accommodation case accommodates a motor attachment bracket comprising:
        a flat motor mount having a first side and a second side opposite the first side;
        an output shaft insertion hole extending through the first side and the second side of the motor mount through which an output shaft of a motor extends; and
        a fluid path in which a cooling fluid is circulated,
    wherein the second side of the motor mount is fixed to the motor attachment wall to be disposed along the motor attachment wall, the motor is fixed to the first side of the motor mount which is opposite to the motor attachment wall, and the output shaft of the motor extends through the output shaft insertion hole in the motor mount and a shaft insertion hole formed in the motor attachment wall.

7. The substrate processing apparatus of claim 6, wherein the motor attachment bracket is made of metal.

8. The substrate processing apparatus of claim 6, further comprising:
    a cooling portion extending from the motor mount and having the fluid path disposed therein.

9. The substrate processing apparatus of claim 8, wherein the cooling portion extends from the motor mount to be perpendicular to the motor.

* * * * *